(12) United States Patent
Gupta et al.

(10) Patent No.: US 9,679,649 B2
(45) Date of Patent: Jun. 13, 2017

(54) RECONFIGURABLE CAM

(71) Applicant: Commissariat à l'Énergie Atomique et aux Énergies Alternatives, Paris (FR)

(72) Inventors: Navneet Gupta, Grenoble (FR); Adam Makosiej, Grenoble (FR); Costin Anghel, Vanves (FR); Amara Amara, Sceaux (FR); Olivier Thomas, Revel (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/342,433

(22) Filed: Nov. 3, 2016

(65) Prior Publication Data

US 2017/0133092 A1    May 11, 2017

(30) Foreign Application Priority Data

Nov. 5, 2015 (FR) ...................................... 15 60605

(51) Int. Cl.
*G11C 15/00* (2006.01)
*G11C 15/04* (2006.01)
(52) U.S. Cl.
CPC .................................... *G11C 15/04* (2013.01)
(58) Field of Classification Search
USPC .......................... 365/49.1, 49.11, 49.17, 207
See application file for complete search history.

(56) References Cited

U.S. PATENT DOCUMENTS

| | | | |
|---|---|---|---|
| 6,373,738 B1 * | 4/2002 | Towler | G11C 15/04 365/189.07 |
| 6,839,256 B1 | 1/2005 | Proebsting et al. | |
| 2003/0090921 A1 * | 5/2003 | Afghahi | G11C 15/04 711/108 |
| 2003/0142524 A1 | 7/2003 | Shau | |

OTHER PUBLICATIONS

French Search Report, dated Jun. 29, 2016, from related French Application No. 15/60605.
Andrei Vladimirescu et al.: "Sub-picowatt retention mode TFET memory for CMOS sensor processing nodes," (2015) 6$^{th}$ International Workshop on Advances in Sensors and Interfaces (IWASI); pp. 266-270.

(Continued)

*Primary Examiner* — Vu Le
(74) *Attorney, Agent, or Firm* — Wolf, Greenfield & Sacks, P.C.

(57) ABSTRACT

A content addressable memory having at least one CAM cell including first and second inverters cross-coupled between first and second storage nodes; a first transistor coupling the first storage node to a bitline, the first transistor being controlled by a first control signal; a second transistor coupling the second storage node to the bitline, the second transistor being controlled by a second control signal; and a control circuit adapted to perform a CAM read operation by pre-charging the bitline to a first voltage level, and then selectively activating either the first or second transistor based on a bit of input data.

11 Claims, 7 Drawing Sheets

(56) References Cited

OTHER PUBLICATIONS

Pagiamtzis et al.: "Content-Addressable Memory (CAM) Circuits and Architectures: ATutorial and Survey," (2006) IEEE Journal of Solid-State Circuits; pp. 712-727.
Zhang: "A Low Power Highly Associative Cache for Embedded Systems," (2006) IEEE;. pp. 1-6.
Mazreah et al.: "A Novel Zero-Aware Four-Transistor SRAM Cell for High Density and Low Power Cache Application," (2008) International Conference on Advanced Conference on Advanced Computer Theory and Engineering; pp. 571-575.
Kalokerinos et al.: "FPGA Implementation of a Configurable Cache/Scratchpad Memory with Virtualized User-Level RDMA," (2009) IEEE; pp. 149-156.
Zhao et al.: "Bandwidth-Aware Reconfigurable Cache Design with Hybrid Memory Technologies," (2011) IEEE; pp. 48-55.
Choi et al.: Impact of Cache Architecture and Interface on Performance and Area of FPGA-Based Processor/Parallel-Accelerator Systems, (2012) IEEE $20^{th}$ International Symposium on Field-Programmable Custom Computing Machines; pp. 17-24.
Ullah et al.: "FPGA Implementation of SRAM-based Ternary Content Addressable Memory," (2012) IEEE $26^{th}$ International Parallel and Distributed Processing Symposium Workshops & PhD Forum.
Makosiej et al.: "A 32nm Tunnel FET SRAM for Ultra Low Leakage," (2012) IEEE; pp. 2517-2520.
Wang et al.: "A New 6-Transistor SRAM Cell for Low Power Cache Design," (2012) IEEE.
Jeloka et al.: "A Configurable TCAM/BCAM/SRAM using 28nm push-rule 6T bit cell," (2015) Symposium on VLSI Circuits Digest of Technical Papers, C272-C273.
Gil et al.: "Reconfigurable Cache implemented on an FPGA," (2010) International Conference on Reconfigurable Computing; pp. 205-255.
Ullah et al.: "Hybrid Partitioned SRAM-Based Ternary Content Addressable Memory," (2012) IEEE Transactions on Circuits and Systems; pp. 2969-2979.

\* cited by examiner

RECONFIGURABLE CAM

CROSS-REFERENCE TO RELATED APPLICATION

This application claims the benefit of French patent application number 15/60605, filed Nov. 5, 2015, which is hereby incorporated by reference in its entirety to the maximum extent allowable by law.

FIELD

The present disclosure relates to the field of content addressable memories (CAMs) and to a method of performing a CAM read operation.

BACKGROUND

A content addressable memory (CAM) is a device that is capable of comparing an input data word with data words stored within its memory array, and returning a miss each time a word in the memory does not match the input data word, and a hit each time a word in the memory matches the input data word.

It is generally desirable that CAM devices are capable of fast operation, as for each CAM read operation all words in the memory array are generally accessed to generate a hit or miss value for every word of the array. To allow for a fast operation, the comparison of the bits of an input word with the bits stored in the CAM is performed within each memory cell of the CAM. This leads to the memory cells of a CAM being more complex and larger than those of a conventional SRAM (static random access memory) cell.

In some applications, the CAM function is not always required, and there is thus a need in the art for a CAM that is capable of being entirely or partially used as an SRAM during periods in which the CAM function is not required. Furthermore, there is a need in the art for a relatively compact CAM cell.

SUMMARY

It is an aim of embodiments of the present description to at least partially address one or more needs in the prior art.

According to one aspect, there is provided a content addressable memory (CAM) comprising at least one CAM cell comprising: first and second inverters cross-coupled between first and second storage nodes; a first transistor coupling the first storage node to a bitline, the first transistor being controlled by a first control signal; a second transistor coupling the second storage node to the bitline, the second transistor being controlled by a second control signal; and a control circuit adapted to perform a CAM read operation by pre-charging the bitline to a first voltage level, and then selectively activating either the first or second transistor based on a bit of input data.

According to one embodiment, the CAM further comprises a detection circuit adapted to detect a CAM hit or miss based on the voltage level on the bitline, or on a first supply voltage rail of the first and second inverters, following the activation of the first or second transistor.

According to one embodiment, the detection circuit is coupled to the bitline.

According to one embodiment, the detection circuit is coupled to the first supply voltage rail of the first and second inverters.

According to one embodiment, the CAM further comprises a plurality of the CAM cells coupled to the bitline, the plurality of CAM cells forming a CAM word, and the bits of input data of the plurality of CAM cells form a word, and the detection circuit is adapted to detect a word hit or miss based on the voltage level on the bitline, or on the first supply voltage rail, following the activation of the first or second transistor.

According to one embodiment, the detection circuit is adapted to detect a hit by detecting a voltage change less than a first threshold, and to detect a miss by detecting a voltage change higher than the first threshold.

According to one embodiment, the control circuit is further adapted to perform an SRAM read operation of a data value stored at the first and second storage nodes by pre-charging the bitline to the first voltage level or to another voltage level, and activating the first transistor.

According to one embodiment, the control circuit is further adapted to perform a write operation to the first and second storage nodes of the at least one CAM cell by coupling the bitline to the first voltage level or to another voltage level while selectively activating the first or second transistor based on a data bit to be written to the CAM cell.

According to one embodiment, the bitline comprises first and second portions, the first transistor being coupled to the first portion and the second transistor being coupled to the second portion, the first and second portions being coupled together by a further transistor, the control circuit being adapted to perform a write operation to the at least one memory cell by deactivating the further transistor and applying independent voltages to the first and second portions.

According to one embodiment, the first and second inverters of the at least one CAM cell are coupled between a first supply voltage rail at the first voltage level and a second supply voltage rail at a second voltage level higher than ground and lower than the first voltage level, and during a write operation to the at least one CAM cell, one of the first and second transistors is activated by a voltage lower than the first supply voltage.

According to one embodiment, the at least one CAM cell further comprises: a third transistor coupled between the second storage node and a further bitline, the third transistor being controlled by the second control signal; and a fourth transistor coupled between the first storage node and the further bitline, the fourth transistor being controlled by the first control signal, the first, second, third and fourth transistors being TFETs (Tunnel Field Effect Transistors).

According to one embodiment, the at least one CAM cell further comprises a fifth transistor coupled between the further bitline and a read out line, a control node of the fifth transistor being coupled to the second storage node.

According to one embodiment, the CAM comprises: at least one further CAM cell coupled to the bitline by a first transistor controlled by a first control signal and by a second transistor controlled by a second control signal, the control circuit being adapted to mask the at least one further CAM cell during the CAM read operation by deactivating both of the first and second transistors of the at least one further CAM cell during the CAM read operation.

According to a further aspect, there is provided a method of performing a CAM (content addressable memory) operation in at least one CAM cell comprising: first and second inverters cross-coupled between first and second storage nodes; a first transistor coupling the first storage node to a bitline, the first transistor being controlled by a first control signal; and a second transistor coupling the second storage node to the bitline, the second transistor being controlled by a second control signal, the method comprising: pre-charging, by a control circuit, the bitline to a first voltage level; and selectively activating, by the control circuit, either the first or second transistor based on a bit of input data.

According to one embodiment, the method further comprises: detecting, by a detection circuit, a hit or a miss based on the voltage level on the bitline, or on a power supply rail of the first and second inverters, following the activation of the first or second transistor.

According to a further aspect, there is provided a memory comprising a plurality of memory cells coupled to a bitline, each memory cell comprising: first and second inverters cross-coupled between first and second storage nodes; and a first transistor coupling the first storage node to the bitline, the memory further comprising a detection circuit adapted to read data bits stored by the memory cells, wherein the detection circuit is coupled to a first supply voltage rail of the first and second inverters of each memory cell. For example, the detection circuit is adapted to detect the presence or absence of a voltage rise or a voltage drop on the first supply voltage rail.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

While in the following description CAM cells and CAM arrays are described that can be used as standard SRAM devices, it will be apparent to those skilled in the art that for some applications these arrays may be configured to operate exclusively as CAMs.

The term "connected" is used herein to designate a direct electrical connection between two components, whereas the term "coupled" is used to designate a connection that may be direct or may be via one or more further components such as resistors, capacitors or transistors. The term "around" is used to designate a tolerance of +/−10% of the value in question.

Figure 1:
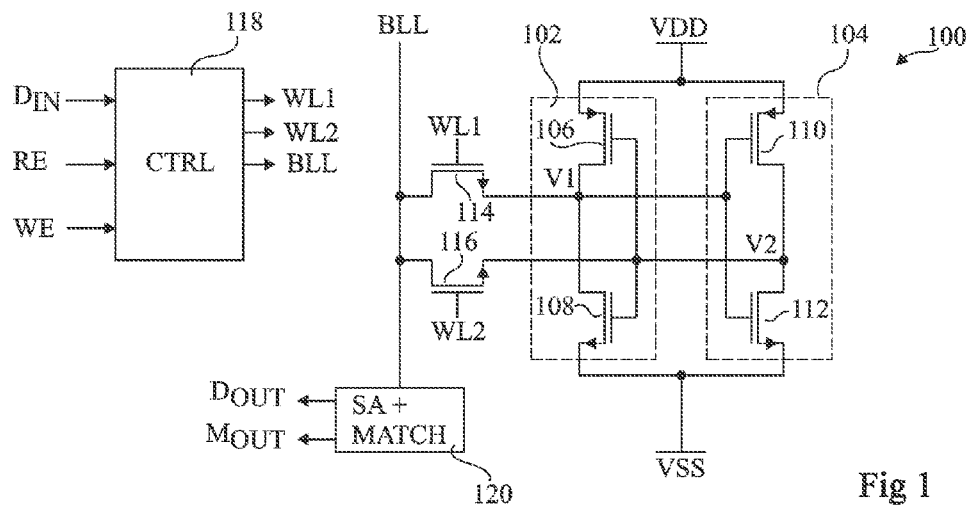
FIG. 1 schematically illustrates a CAM cell according to an example embodiment.

FIG. 1 schematically illustrates a CAM cell 100 according to an example embodiment. The cell for example comprises a storage portion formed by cross-coupled inverters 102, 104 that form a latch type structure. The inverters 102, 104 are cross-coupled between storage nodes V1, V2. For example, the inverter 102 comprises transistors 106 and 108 coupled by their main conduction nodes between a supply voltage rail VDD and a supply voltage rail VSS. An intermediate node between the transistors 106, 108 forms the storage node V1, and the control nodes of transistors 106, 108 are coupled to the storage node V2. The inverter 104 for example comprises transistors 110 and 112 coupled by their main conduction nodes between the supply voltage rails VDD and VSS. An intermediate node between the transistors 110, 112 forms the storage node V2, and the control nodes of transistors 110, 112 are coupled to the storage node V1.

The storage node V1 is coupled to a bitline BLL via the main conducting nodes of a transistor 114. Similarly, the storage node V2 is coupled to the bitline BLL via the main conducting nodes of a transistor 116. The transistor 114 is controlled at its control node by a control signal WL1, and the transistor 116 is controlled at its control node by a control signal WL2, where the control signals WL1, WL2 are for example word line control signals for controlling SRAM words, as will be described in more detail below. The transistors 106 to 116 are for example MOS transistors, the transistors 114 and 116 for example being n-channel MOS (NMOS) transistors having their gates connected to the signals WL1 and WL2 respectively. A source/drain node of transistor 114 is for example connected to the node V1 and a source/drain node of transistor 116 is for example connected to the node V2.

The control signals WL1 and WL2 are for example generated by a control circuit (CTRL) 118, which for example receives an input data value DIN, and read and write enable signals RE and WE. The control circuit 118 also for example applies voltages to the bitline BLL, to pre-charge the bitline, and couple the bitline to a supply voltage, as will be described in more detail below.

The bitline BLL is for example coupled to a detection circuit (SA+MATCH) 120 performing the roles of a sense amplifier and matching circuit. The detection circuit 120 for example generates, based on a voltage level detected on the bitline BLL, an output data signal DOUT during a standard SRAM read operation, or a CAM hit/miss signal MOUT during a CAM mode read operation.

The CAM cell 100 is for example capable of being reconfigured to operate as either a CAM cell, involving CAM mode read and write operations, or to operate as an SRAM cell, involving SRAM read and write operations.

The supply voltage rail VDD of the CAM cell 100 is for example at a voltage in the range 0.6 V to 1.4 V, and for example at around 1.2 V. The supply voltage rail VSS is for example at a voltage in the range −0.6 V to 0.6 V, and for example at around 0.6 V, and the voltage difference between the supply voltage rails VDD and VSS is for example equal to at least 0.6 V, and for example equal to around 0.8 V.

During a retention mode of the CAM cell 100, the control signals WL1 and WL2 are for example at the voltage level VSS and the bitline BLL is for example at the voltage level VSS or VDD or any level there between, such that there is low leakage current from the cell towards the bitline.

During CAM mode and SRAM write operations described in more detail below, the bitline BLL is for example brought down to ground or a lower voltage, and one of the control signals WL1, WL2 is activated by a voltage equal for example to a level between ground and VDD such as VSS, which is for example equal to around VDD/2. The term "activated" in relation to a control signal is used herein to refer to a state of the control signal that renders conductive one or more transistors to which it is coupled. The other control signal is for example deactivated by bringing it to ground.

During CAM mode or SRAM read operations, the bitline BLL is for example brought to the voltage level VDD, and one of the control signals WL1, WL2 is activated by bringing it to the voltage level VDD. The other control signal is for example deactivated by bringing it to the voltage level VSS.

Operation of the CAM cell 100 of FIG. 1 will now be described in more detail with reference to FIGS. 2A and 2B.

Figure 2A:
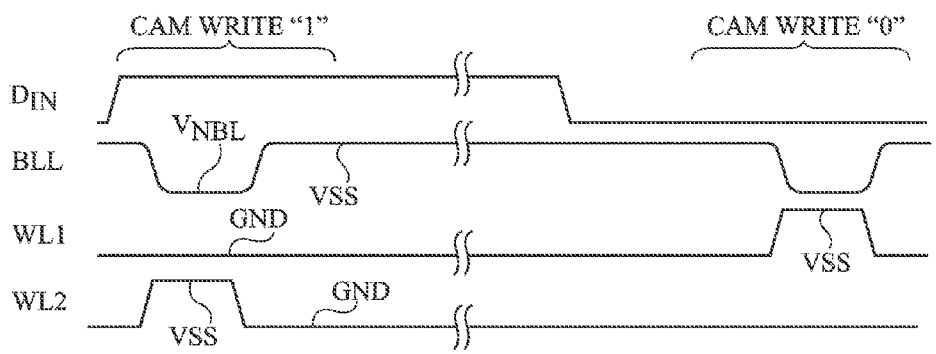
FIG. 2A is a timing diagram illustrating examples of signals in the CAM cell of FIG. 1 during CAM mode write operations according to an example embodiment.

FIG. 2A is a timing diagram illustrating an example of the input data signal DIN, the voltage on the bitline BLL, and the control signals WL1 and WL2, during a CAM mode write operation to the CAM cell 100. It is assumed in this example that the CAM cell 100 is coupled to a single bitline BLL.

It is assumed that during the CAM mode write operation the write enable signal WE is asserted. In a first example, a "1" value is written to the CAM cell, and thus the data signal DIN is high during the write operation.

During the CAM mode write operation, the control circuit 118 for example applies a voltage VNBL to the bitline BLL, where VNBL is for example lower than VSS and equal to ground or to a voltage between 0 V and the voltage level VSS. Alternatively, the bitline BLL could be brought to a negative level, for example using an SRAM write assist technique known in the art as negative bitline write assist (NBL-WA). Furthermore, during the write operation, the supply voltage VDD may be reduced, for example by around 0.1 V, corresponding to an SRAM supply under drive write assist (Vddud-WA) technique. While the bitline BLL is at the reduced level, the control circuit 118 activates the control signal WL1 or WL2 based on the data signal to be stored in the cell. The control signal WL1 or WL2 is for example activated by bringing it to the level VSS.

As shown on the left in FIG. 2A, in the case that the data signal is a "1" value, the control signal WL2 is for example activated in order to pull the voltage at the node V2 to a low level, and cause the latch formed by the inverters 102, 104 to flip to a state in which V1 is high and V2 is low. For example, to store write data of "1", a voltage of around 0.6 V is applied to the control line WL2, and a voltage of around 0 V is applied to the control line WL1. In the case that the transistors 114, 116 are NMOS transistors, they are for example activated by high levels of the control signals WL1, WL2. If however these transistors were PMOS transistors, they would be activated by a low level of the control signals WL1, WL2.

FIG. 2A also illustrates, on the right, an example of writing a "0" value to the CAM cell, which for example involves activing the control signal WL1 during the write operation, to pull the voltage at the node V1 to a low level. For example, to store write data of "0", a voltage of around 0.6 V is applied to the control line WL1, and a voltage of around 0 V is applied to the control line WL2.

In alternative embodiments, it would be possible to write to the CAM cell 100 by applying a boosted voltage higher than VDD to the bitline BLL, and activating the control signal WL1 or WL2 to bring the node V1 or V2 to a high level. In such a case, the transistors 114 and 116 are for example implemented by PMOS transistors.

The CAM cell 100 is for example part of an array, with a plurality of the cells arranged in a column and coupled to a common bitline, and plurality of columns. Each column of cells for example forms a CAM word. The cells of each row of the columns share common control lines WL1 and WL2. During a write operation, a CAM word of memory cells is for example written in one go, and the other columns of CAM cells are for example half-selected to avoid writing to them. To half select the CAM cells of a column, the bitline of the column is for example brought to a voltage of around the level of VSS.

Figure 2B:
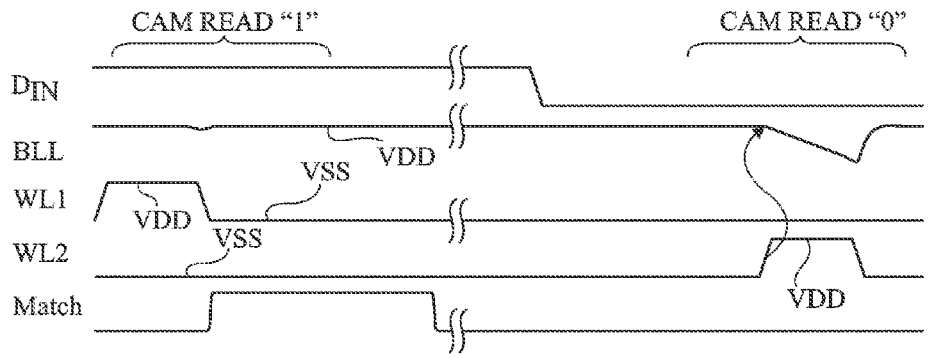
FIG. 2B is a timing diagram illustrating examples of signals in the CAM cell of FIG. 1 during CAM mode read operations according to an example embodiment.

FIG. 2B is a timing diagram illustrating an example of the input data signal DIN, the voltage on the bitline BLL, the control signals WL1 and WL2, and the output signal MOUT during a CAM mode read operation in the CAM cell 100. It is assumed in this example that the CAM cell 100 is coupled to a single bitline BLL.

In a first example shown on the left in FIG. 2B, the data bit stored in the CAM cell 100 is to be compared with a "1" value. Thus the input data signal DIN is for example high during the CAM read operation. At the start of the CAM read operation, the bitline BLL is for example pre-charged to the level of VDD, for example to a level of around 1.2 V. One of the control signals WL1, WL2 is then activated based on the input data bit DIN to be compared. For example, the control signal WL1 or WL2 is activated by bringing it from the voltage level VSS to the voltage level VDD. Alternatively, an SRAM read assist technique, such as wordline under drive read assist (WLud-RA) can be used, in which case the activated control line WL1 or WL2 is for example brought to a level of around 0.2 V less than VDD, for example to a level of around 1 V. The other control signal is for example deactivated by keeping it at the voltage level VSS.

As shown on the left in FIG. 2B, for a CAM mode read operation based on a "1" value of the input data, the control signal WL1 is for example activated to couple the node V1 to the bitline BLL. In the example of FIG. 1, the storage node V1 is at a high state, and thus the voltage on the bitline BLL for example stay highs. In general, a CAM read operation will involve comparing a plurality of bits on an input data word to a word stored in a corresponding plurality of CAM cells of a column of the CAM array. Thus generally, if the voltage on the bitline remains high, this will indicate a word hit.

As shown on the right in FIG. 2B, for a CAM mode read operation based on a "0" value of the input data, the control signal WL2 is for example activated in order to couple the node V2 to the bitline BLL. In this case, it is again assumed that the node V1 is at a high state, and thus the node V2 is at a low state. Thus shortly after the control signal WL2 is activated, the voltage on the bitline BLL for example starts to fall, and the fall in voltage, which may be a drop of only 100 mV, is for example detected by a sense amplifier of the detection circuit 120. Thus the signal MOUT for example remains low, indicating a CAM miss.

An SRAM read operation involves outputting the data value stored by the CAM cell 100 to provide an output data value DOUT. This operation is not represented in the figures, and for example involves pre-charging the bitline BLL to VDD, and then activating the control signal WL1 to couple the node V1 to the bitline BLL, and detecting by the detection circuit 120 whether or not the voltage on the bitline BLL remains at or close to VDD, or falls. A horizontal word of the array is for example read in one operation.

When the CAM cell 100 is part of an array as described above, the CAM cells of each CAM word will share common control lines WL1, WL2 with the corresponding cells of the other columns, and thus a CAM search can be performed in a single operation over the entire array.

In some embodiments, global masking can be performed when performing the CAM read operation. In particular, a CAM search may be performed based on only certain bits of a word, one or more other bits of the word being set to a "don't care" state by keeping deactivated both of the signals WL1, WL2 associated with these bits. Furthermore, in some embodiments, mask bits for enabling a partial comparison may be stored in a separate SRAM to the CAM memory, in a similar fashion to what is described in US patent U.S. Pat. No. 6,839,256, the contents of which are hereby incorporated by reference to the extent permitted by the law.

In some embodiments, each column of the CAM memory may store a plurality of words, and during each CAM search, only one of the words of each column is for example searched at a time, the other words being masked by deactivating the corresponding signals WL1 and WL2.

Figure 3A:
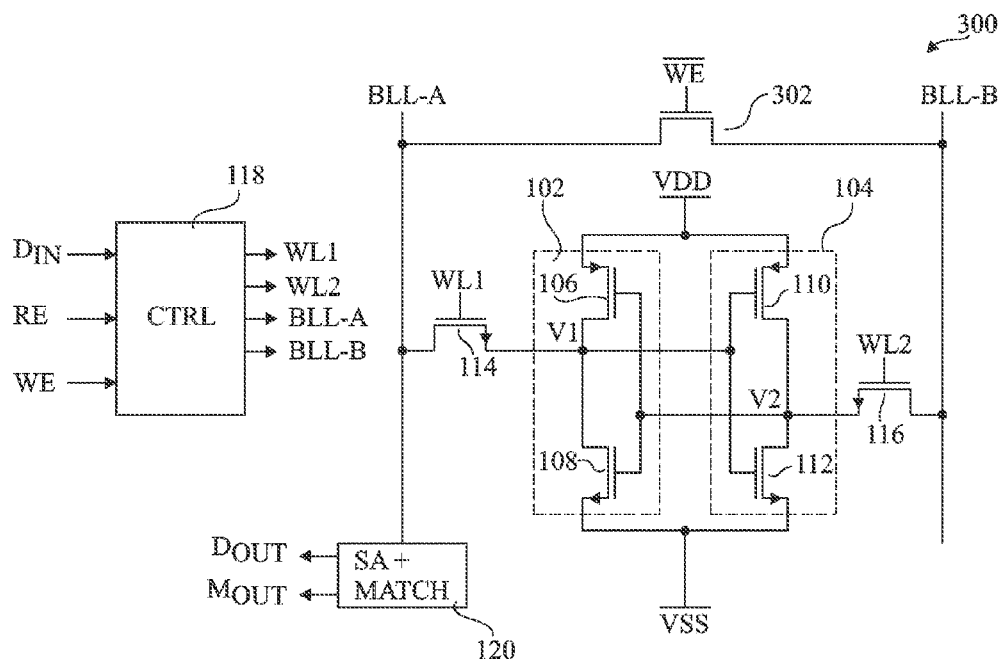
FIG. 3A schematically illustrates a CAM cell according to a further example embodiment.

FIG. 3A illustrates a CAM cell 300 according to an alternative embodiment to that of FIG. 1. Many features in FIG. 3A are the same as features in FIG. 1, and these features have been labelled with like reference numerals and will not be described again in detail.

In the circuit of FIG. 3A, the bitline BLL is split into two portions BLL-A and BLL-B. The transistor 114 is coupled between the storage node V1 and the bitline portion BLL-A, and the transistor 116 is coupled between the storage node V2 and the bitline portion BLL-B. The bitline portions BLL-A and BLL-B are for example coupled together by a transistor 302, which is for example an NMOS transistor. The transistor 302 is for example common for a whole column. The transistor 302 is for example controlled at its control node so that it is activated at least during CAM read operations. In some embodiments, as shown in FIG. 3A, the transistor 302 is controlled by the inverse of the write enable signal WE, such that the bitline portions BLL-A and BLL-B are coupled together except during write operations. The detection circuit 120 is for example coupled to only one of the bitline portions BLL-A, BLL-B, and in the example of FIG. 3A it is coupled to the bitline portion BLL-A. CAM and SRAM read operations are for example performed in the same manner as described above in relation to FIG. 1, with transistor 302 activated.

The feature of splitting the bit line into portions BLL-A, BLL-B as described in relation with FIG. 3A could be used in combination with a read operation made via a supply voltage rail of each memory cell, as will be described in more retail below with reference to FIGS. 9A and 9B. Alternatively, this feature could be combined with a different type of read operation, for example one in which the bit lines are used to read out data from the memory cells.

Write operations to the CAM cell of FIG. 3A are for example performed in a similar fashion to a standard SRAM write operation using the bitline portions BLL-A and BLL-B. During write operations, the transistor 302 is for example deactivated such that the bitline portions BLL-A and BLL-B can be driven independently. During a write operation, the control circuit 118 is for example adapted to couple one of the bitline portions BLL-A, BLL-B to the supply voltage VDD based on the data to be written to the cell, and to couple the other bitline portion to the ground voltage, while activating both of the control signals WL1, WL2. In this manner, during write operations, a row of the array can be written in a single operation.

Figure 3B:
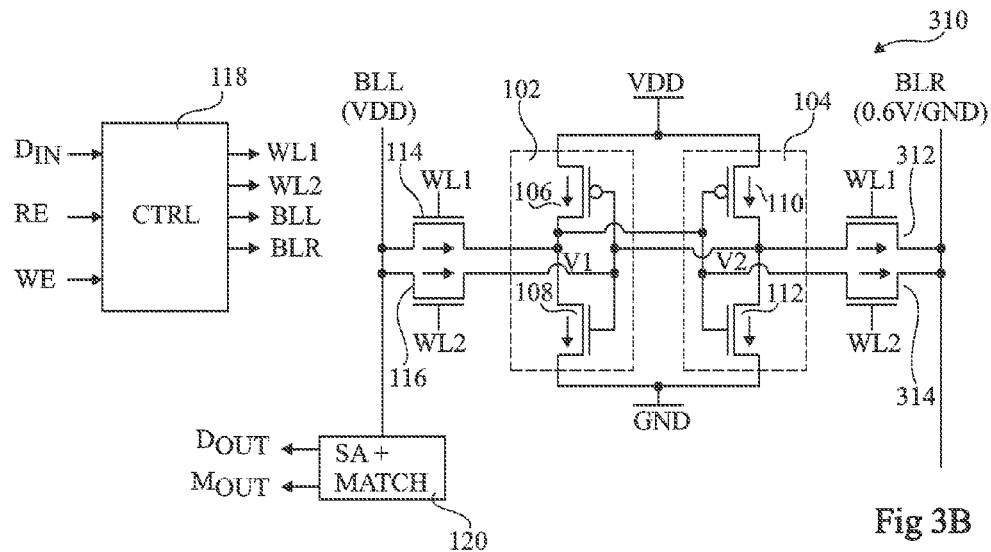
FIG. 3B schematically illustrates a CAM cell according to yet a further example embodiment.

FIG. 3B illustrates a CAM cell 310 according to an alternative embodiment to that of FIGS. 1 and 3A. The CAM cell of FIG. 3B is very similar to the circuit of FIG. 1, and includes the transistors 114 and 116 each coupled to the bitline BLL. The embodiment of FIG. 3B also includes a further bitline BLR, and a transistor 312 coupling the storage node V2 to the bitline BLR, and a transistor 314 coupling the storage node V1 to the bitline BLR. The transistor 312 is controlled by the control signal WL1, and the transistor 314 is controlled by the control signal WL2. The control circuit 118 in FIG. 3B for example applies voltages to both of the bitlines BLL and BLR.

In the CAM cell 310, all of the transistors are TFET (tunnel field effect transistor) devices. Such devices have the advantage of very low current leakage. TFET devices conduct in one direction, indicated in FIG. 3B by an arrow associated with each device. The transistors 114 and 116 are for example arranged to conduct from the bitline BLL towards the storage nodes V1 and V2 respectively. The transistors 106, 108, 110 and 112 are arranged to conduct from the supply voltage rail VDD, towards the ground supply rail GND. The transistors 312 and 314 are arranged to conduct from the storage nodes V1 and V2 respectively, towards the bitline BLR.

Operation of the CAM cell 310 is similar to that of the CAM cell 100 of FIG. 1. However, during a CAM mode write operation, the bitline BLL is for example brought to the supply voltage level VDD, for example equal to 1 V, and the bitline BLR is brought to ground. The control line WL1 or WL2 is then activated by a voltage of around VDD, based on the data bit to be stored in the CAM cell. The CAM cells of other columns of the array are for example half-selected by an intermediate level applied to their bitlines BLR, for example of 0.6 V. Furthermore, during a CAM mode read operation, the bitline BLR is for example at the intermediate level, for example of 0.6 V. During an SRAM write, the write operation is for example performed in two phases, one phase for writing a "0" value to the CAM cells of a row of the array to be written, and one phase for writing a "1" value to the CAM cells of the row.

For example, in a first phase, the cells of the row to be written with a "1" are selected by coupling their bitline BLL to the voltage VDD and their bitline BLR to the ground voltage. The other memory cells in the row are for example half-selected by coupling their bitlines BLR to an intermediate level, for example equal to around 0.6 V. The signal WL1 is then activated and not the signal WL2, in order to write a "1" value to the selected memory cells.

In a second phase, the cells of the row to be written with a "0" are selected by coupling their bitline BLL to the voltage VDD and their bitline BLR to the ground voltage. The other memory cells in the row are for example half-selected by coupling their bitlines BLR to an intermediate level, for example equal to around 0.6 V. The signal WL2 is then activated and not the signal WL1, in order to write a "0" value to the selected memory cells.

During an SRAM read operation, the bitlines BLL are pre-charged to VDD, and the bitlines BLR are brought to an intermediate level, for example of 0.6 V. The signal WL1 is then for example activated for the row to be read, and the voltages on the bitlines BLL will indicate the read data.

Figure 4A:
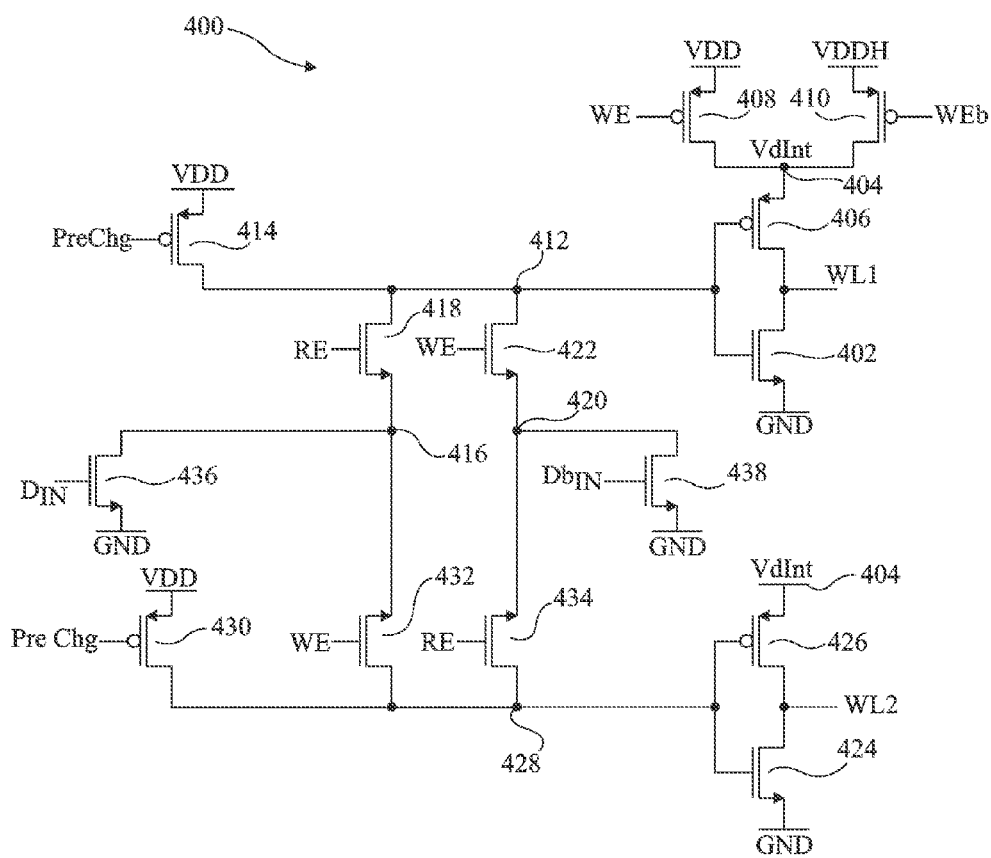
FIG. 4A schematically illustrates a control line driver of a control circuit of FIGS. 1 and 3A in more detail according to an example embodiment.

FIG. 4A schematically illustrates an example embodiment of a certain part 400 of the control circuit 118 of FIGS. 1 and 3A for generating the control signals WL1, WL2. The circuit 400 is for example common for all CAM cells in a row of an array, and a similar circuit is for example provided for each other row.

The line WL1 is for example coupled to ground (GND) via a transistor 402, and to an intermediate node 404 via a transistor 406. The intermediate node has a voltage VdInt, and is coupled to the VDD supply rail via a transistor 408, and to a supply rail VDDH via a transistor 410. The supply rail VDDH is for example at a voltage level lower than VDD and higher than ground, such that 0<VDDH<VDD. For example, in one embodiment VDDH is at around half VDD. The transistor 408 is controlled by the write enable signal WE, and the transistor 410 is controlled by the inverse WEb of the write enable signal WE.

The transistors 402, 406 have their control nodes coupled to a node 412, which is in turn coupled to the VDD supply rail via a transistor 414, to a node 416 via a transistor 418, and to a node 420 via a transistor 422. The transistor 414 is for example controlled by a pre-charge signal PreChg, the transistor 418 is controlled by the read enable signal RE, and the transistor 422 is controlled by the write enable signal WE.

The line WL2 is for example coupled to the ground rail GND via a transistor 424, and to the VdInt voltage at node 404 via a transistor 426. The transistors 424, 426 have their control nodes coupled to a node 428, which is for example in turn coupled to the VDD supply rail via a transistor 430, to the node 416 via a transistor 432 and to the node 420 via a transistor 434. The transistor 430 is controlled by the pre-charge signal PreChg, the transistor 432 is controlled by the write enable signal WE, and the transistor 434 is controlled by the read enable signal RE.

The node 416 is coupled to the ground rail GND via a transistor 436 controlled by the data value DIN, and the node 420 is coupled to the ground rail GND via a transistor 438 controlled by the inverse DbIN of the data value DIN.

The transistors 402, 418, 422, 424, 432, 434, 436 and 438 are for example NMOS transistors, and the transistors 406, 408, 410, 414, 426 and 430 are for example PMOS transistors.

In operation, during a write operation, first the pre-charge signal PreChg is activated to a low level to bring the nodes 412 and 428 to VDD. The signals WE and PreChg are then for example brought high, and the signals WEb and RE are for example brought low. Thus, if the data value DIN is a "1" value, the line WL2 is coupled to the voltage VdInt, which is at VDDH, and the line WL1 is coupled to ground. Alternatively, if the data value DIN is a "0" value, the line WL1 is coupled to the voltage VdInt, which is at VDDH, and the line WL2 is coupled to ground.

When a CAM mode read operation is to be performed, the signal PreChg is first activated to a low level to bring the nodes 412 and 428 to VDD. Then, the signal PreChg is brought high again, and the signal RE is brought high, while the signal WE is low. Thus the line WL1 will be coupled to VDD if the input data value DIN is a "1", and to ground if the input data value DIN is a "0". Conversely, the line WL2 will be coupled to VDD if the input data value DIN is a "0", and to ground if the input data value DIN is a "1".

The circuit 400 can for example be adapted to implement a certain part of the control circuit 118 of the CAM cell 310 of FIG. 3B by removing the transistors 408 and 410, and coupling the node 404 directly to VDD.

Figure 4B:
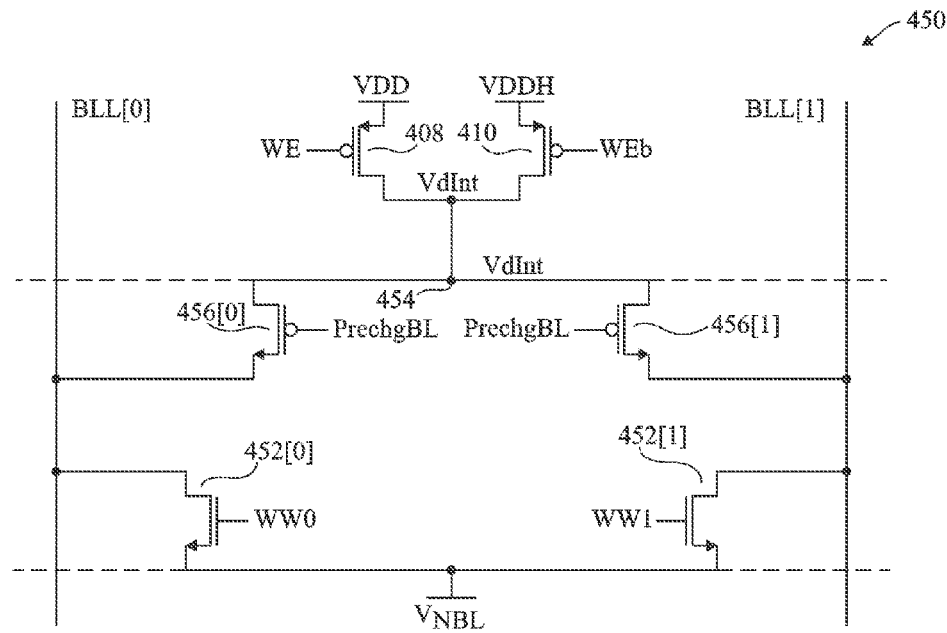
FIG. 4B schematically illustrates a bitline driver of the control circuit of FIG. 1 in more detail according to an example embodiment.

FIG. 4B schematically illustrates an example implementation of a certain part 450 of the control circuit 118 of FIG. 1 for controlling the voltage on the bitlines BLL[0] and BLL[1] of adjacent columns 0 and 1 of the array.

The bitline BLL[0] is for example coupled to the voltage rail VNBL via a transistor 452[0] associated with column 0 and is controlled by a signal WW0, and the bitline BLL[1] is coupled to the voltage rail VNBL via a transistor 452[1] associated with column 1 controlled by a signal WW1. The signals WW0 and WW1 are data signals based on the data to be written to selected CAM cells of the corresponding columns 0 and 1. The voltage rail VNBL is for example at ground, or at a negative voltage level.

The bitline BLL[0] is also coupled to a node 454 via a transistor 456[0] associated with the column 0, and the bitline BLL[1] is also coupled to the node 454 via a transistor 456[1] associated with the column 1. The node 454 has a voltage VdInt, which is the same voltage as at node 404 of FIG. 4A, and is for example generated by the same circuit comprising transistors 408, 410, which will not be described again in detail. The transistors 456[0], 456[1] are controlled by a pre-charge signal PrechgBL. Thus when the bitlines BLL[0], BLL[1] are to be pre-charged to VDD during a CAM mode or SRAM read operation, the signal PrechgBL is activated at a low level to render the transistors 456[0] and 456[1] conductive, and the write enable signal WE is low, such that the node 454 is coupled to the VDD supply rail. A pair of transistors 452[p], 456[p] is for example provided for each column p of the array.

As with circuit 400, the circuit 450 can for example be adapted to implement a certain part of the control circuit 118 of the CAM cell 310 of FIG. 3B by removing the transistors 408 and 410, and coupling the node 454 directly to VDD. A similar circuit can be provided for coupling the bitline BLR to either ground or 0.6 V.

In the case of the CAM cell 300 of FIG. 3A, the circuit 450 for example comprises a transistor 452[p] for each of the bitline portions BLL-A, BLL-B of each column p, such that the bitline portions can be controlled independently during a write operation.

Figure 5A:
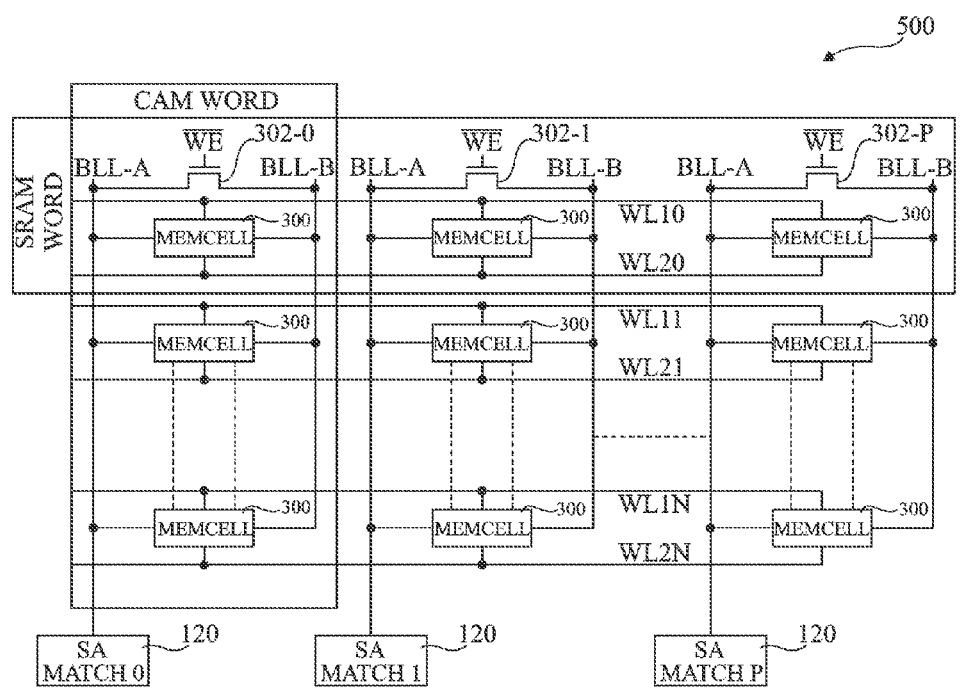
FIG. 5A schematically illustrates a reconfigurable CAM/SRAM array comprising CAM cells of FIG. 3A according to an example embodiment.

FIG. 5A schematically illustrates a CAM array 500 comprising an array of CAM cells, which are for example the CAM cells 300 of FIG. 3A coupled to the split bitline portions BLL-A and BLL-B. However, a configuration similar to that of FIG. 5A could be adapted to the memory cell of FIG. 1. The array 500 for example comprises a plurality P+1 of columns, each column storing a CAM word, and each column for example comprising a plurality N+1 of memory cells forming the CAM word. Furthermore, each row of P+1 CAM cells for example forms an SRAM word. P and N are each for example equal to 1 or more, and typically there are for example 16, 32 or 64 columns, and 16, 32 or 64 rows. In some embodiments, the number of rows is equal to the number of columns, such that a CAM word is equal in length to an SRAM word. However, in alternative embodiments there could be a different number of rows than columns.

The split bitline portions BLL-A, BLL-B of each column 0 to P are for example coupled together by corresponding transistors 302-0 to 302-P controlled for example by the inverse of the write enable signal WE. Indeed, as explained above in relation with FIG. 3A, these transistors are for example deactivated at least during write operations to the memory cells such that the cells can be written in a standard SRAM fashion.

Figure 5B:
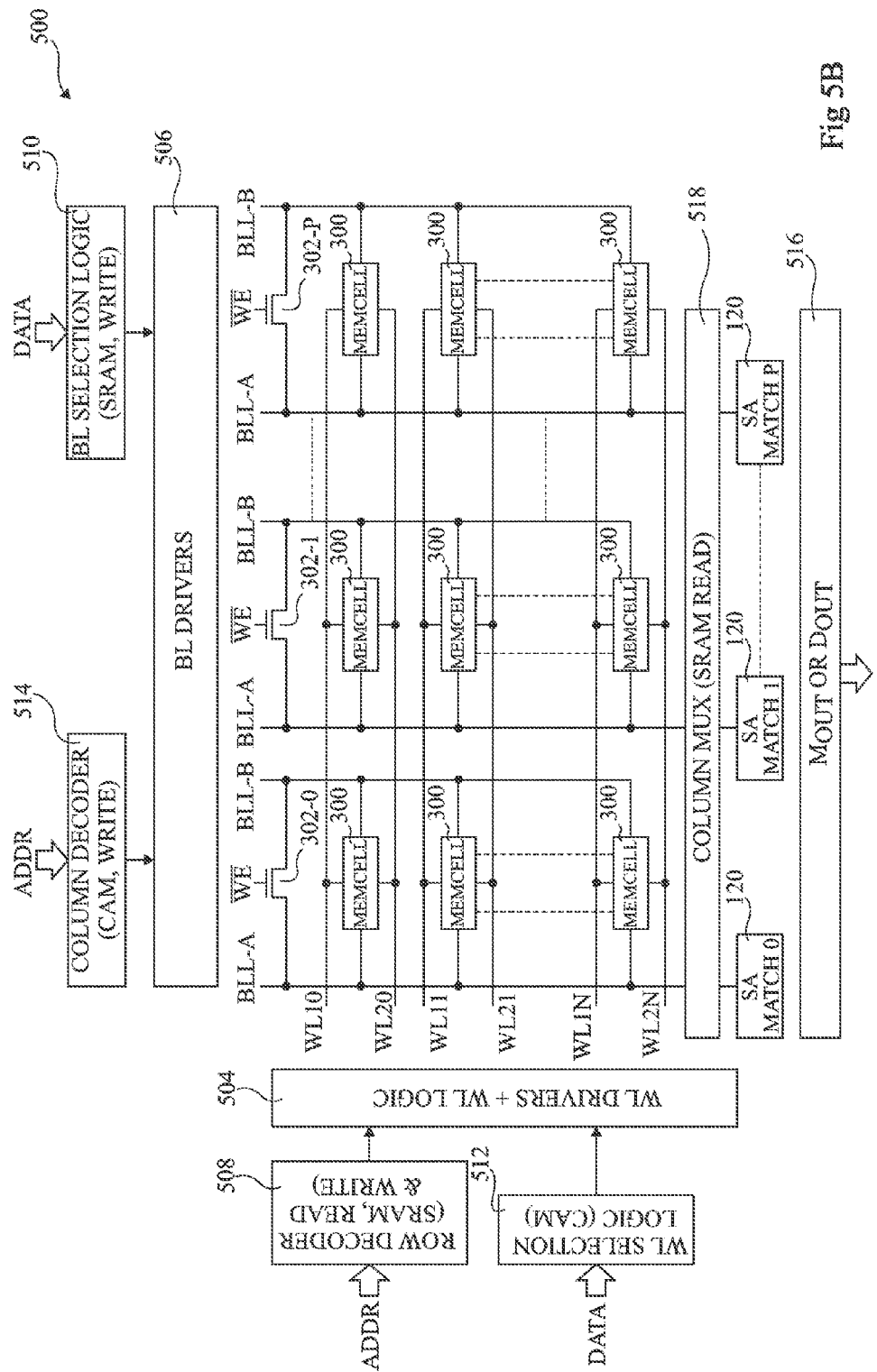
FIG. 5B schematically illustrates the reconfigurable CAM/SRAM array of FIG. 5A in more detail according to an example embodiment.

FIG. 5B schematically illustrates the array of FIG. 5A in more detail according to an example embodiment, and illustrates an example of control circuitry for controlling the CAM cells of the array.

A WL driving circuit (WL DRIVERS+WL LOGIC) 504 for example comprises drivers and logic for driving the word lines WL10, WL20 to WL1N, WL2N of the array.

A bitline driving circuit (BL DRIVERS) 506 for example comprises drivers for driving the bitline portions BLL-A, BLL-B of the columns 0 to P of the array.

During SRAM read and write operations to be performed to a row of the array, a row decoder (ROW DECODER (SRAM, READ & WRITE)) 508 for example receives the address ADDR of the operation, and provides an appropriate selection of one of the word lines to the WL driving circuit 504. In the case of an SRAM write operation, bitline selection logic (BL SELECTION LOGIC (SRAM, WRITE)) 510 for example also receives the data DATA to be written, and provides appropriate control signals to the bitline driving circuit 506 for driving the bitlines accordingly, and for deactivating the transistors 302-0 to 302-P.

During CAM read and write operations to be performed to a column of the array, WL selection logic (WL SELECTION LOGIC (CAM)) 512 for example receives the data DATA to be written or to be used for the CAM read, and provides the appropriate signals for driving the word lines WL10, WL20 to WL1N, WL2N based on this data. For example, the WL selection logic 512 is implemented by the circuit of FIG. 4A. During CAM write operations, a column decoder (COLUMN DECODER (CAM, WRITE)) 514 for example receives the address ADDR of the write operation, and provides appropriate control signals to the bitline driving circuit 506 for driving corresponding bitlines accordingly. The column decoder 514 is for example implemented by the circuit of FIG. 4B.

An output circuit (MOUT or DOUT) 516 for example provides, during a CAM read operation, the hit or miss signal MOUT from each column of the array, and during an SRAM read operation, the data signal DOUT from each column of the array.

In some embodiments, a column multiplexer (COLUMN MUX(SRAM, READ)) 518 is provided for SRAM read operations.

Figure 6:
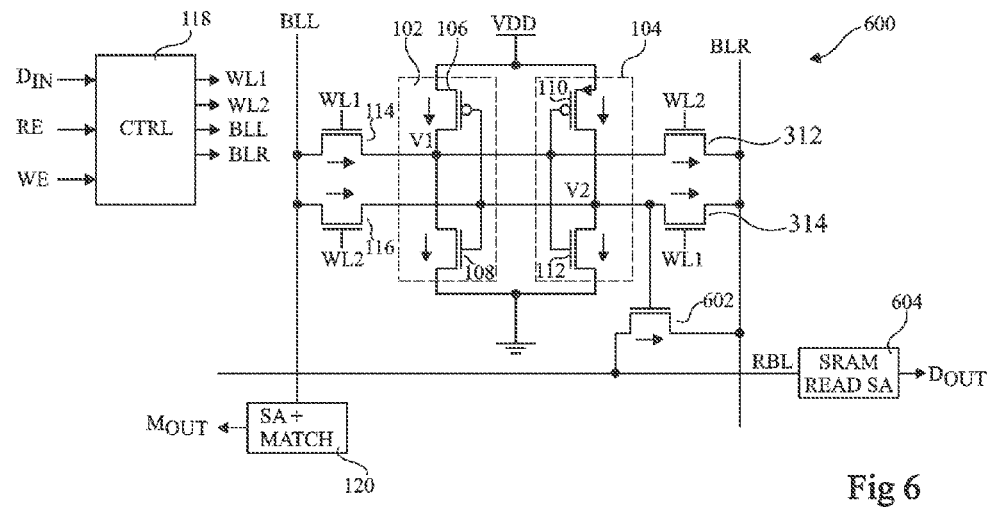
FIG. 6 schematically illustrates a CAM cell according to yet a further example embodiment.

FIG. 6 schematically illustrates a CAM cell 600 according to a further example embodiment. The circuit of FIG. 6 is similar to the CAM cell 310 of FIG. 3B, and like features have been labelled with like reference numerals and will not be described again in detail. The CAM cell 600 additionally comprises a TFET transistor 602, which is for example an NTFET transistor, coupled by its main current nodes between the bitline BLR and a row line RBL. Transistor 602 for example has its control node coupled to the storage node V2 of the cell.

The addition of the transistor 602 for example permits a column of cells to be read during an SRAM read operation. Thus both CAM words, and SRAM words, can be orientation in the same way in the array, in the column direction. This also provides the advantage that the CAM and SRAM words can have the same number of bits, without using a square array. Furthermore, a CAM word and an SRAM word can each be read in a single cycle.

The circuit for example comprises a further detection circuit (SRAM READ SA) 604 for detecting the voltage on the row line RBL, and providing output data DOUT based on the detected voltage level. The detection circuit 120 in FIG. 6 for example provides only the match signal MOUT.

In operation, during an SRAM read operation, the row line RBL is for example pre-charged to VDD, and the bitline BLR is for example coupled to ground. The transistor 602 will be rendered conductive or non-conductive based on the voltage at the storage node V2, and when it is conductive, it will discharge the voltage on the row line RBLbitline. Thus a "1" value at the storage node V1 can be detected, by the detection circuit 604, by detecting when the voltage state on the row line RBL remains close to VDD, and a "0" value at the storage node V1 can be detected by detecting when the voltage state on the row line RBL falls, for example by between 100 and 200 mV for a 1 V supply.

A CAM read operation in the embodiment of FIG. 6 can for example be performed via a supply voltage rail of the memory cells, as will be described in more detail below with reference to FIGS. 9A and 9B. Alternatively, another type of read operation could be used, such as a read operation using the bit lines BLL, BLR to output the read data.

Figure 7:
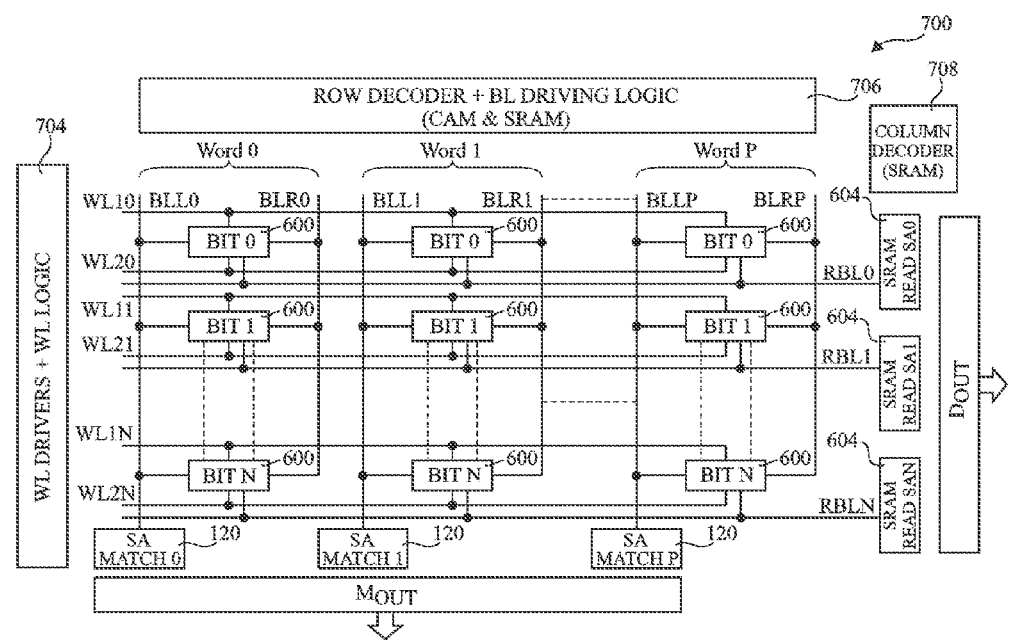
FIG. 7 schematically illustrates a reconfigurable CAM/SRAM array comprising CAM cells of FIG. 6 according to an example embodiment.

FIG. 7 schematically illustrates a CAM array 700 comprising the CAM cells 600 of FIG. 6 arranged in N+1 rows and P+1 columns. As illustrated, each bitline BLL0 to BLLP is coupled to a corresponding detection circuit 120 providing the match signal MOUT and each row line RBL0 to RBLN is coupled to a corresponding detection circuit 604 for providing the SRAM read signal DOUT. A WL control circuit block (WL DRIVERS+WL LOGIC) 704 for example controls the control lines WL10, WL20 to WL1N, WL2N, and a bitline control circuit block (ROW DECODER+BL DRIVING LOGIC (CAM & SRAM)) 706 for example drives the bitlines BLL0, BLR0 to BLLP, BLRP, and the row lines RBL0 to RBLN. A column decoder (COLUMN DECODER (SRAM)) 708 is also for example provided for selecting the column to be written or read during an SRAM write or read operation.

It will be noted that the array 700 allows both the CAM and SRAM words in the array to be stored vertically in columns, but it comprises a greater number of detection circuits when compared with the array of FIG. 5B.

Figure 8:
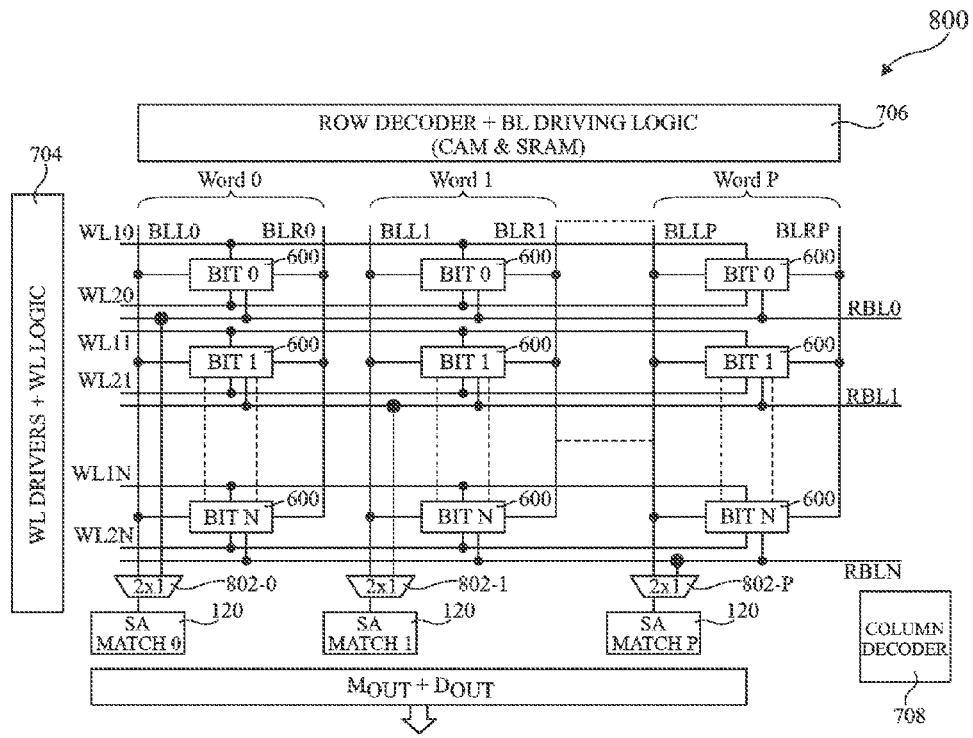
FIG. 8 schematically illustrates a reconfigurable CAM/SRAM array comprising CAM cells of FIG. 6 according to a further example embodiment.

FIG. 8 schematically illustrates an array 800 comprising the CAM cells 600 of FIG. 6 according to an alternative example embodiment in which the number of detection circuits is reduced with respect to the array 700 of FIG. 7. The array 800 is similar to the array 700, but no longer comprises the detection circuits 604, and instead comprises two-input multiplexers 802-0 to 802-P associated with the rows 0 to P, and each having one input coupled to a corresponding bitline BLL0 to BLLP, and another input coupled to a corresponding row line RBL0 to RBLN. In this example, P and N are equal, although in alternative embodiments any values of P and N would be possible. The outputs of the multiplexers are respectively coupled to the detection circuits (SA+MATCH0 to SA+MATCHP) 120, which provide both the match output signals MOUT and the data output signals DOUT. The column decoder 708 of FIG. 7 is for example only used for SRAM access operations, whereas the column decoder 708 of FIG. 8 is for example used for SRAM and CAM operations.

Figure 9B:
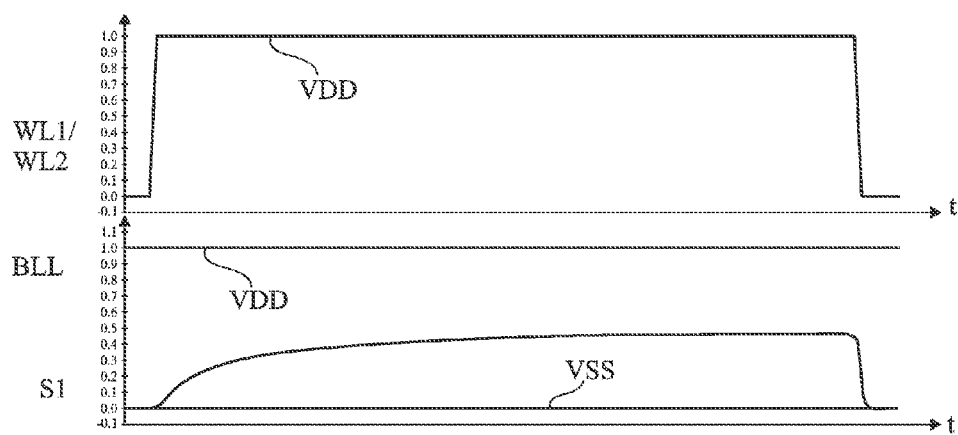
FIG. 9B is a timing diagram illustrating examples of signals in the circuit of FIG. 9A.
Figure 9A:
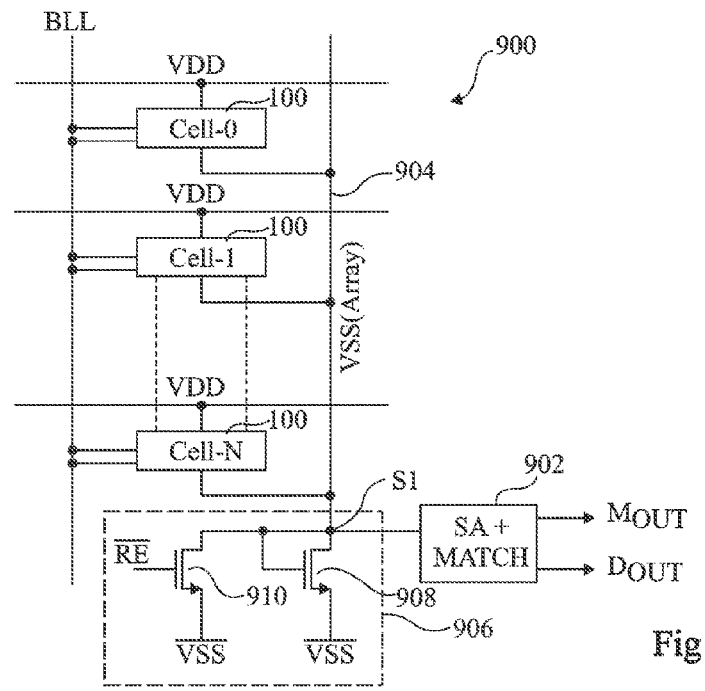
FIG. 9A schematically illustrates a column of CAM cells according to an example embodiment.

FIG. 9A schematically illustrates a column 900 of memory cells 100 according to a further example embodiment. In alternative embodiments, the column 900 could be adapted to comprise the memory cells 300 of FIG. 3A.

The column 900 is for example part of an array having a plurality of such columns. The detection circuit 120 of FIG. 1 coupled to the bitline BLL is replaced in FIG. 9A by a detection circuit (SA+MATCH) 902 coupled to a supply voltage rail 904 of each memory cell of the column. For example, the detection circuit 902 is coupled to the VSS supply voltage rail 904, and the VSS rail 904 is for example coupled, at a footer 906 of the column, to the VSS supply voltage via a diode coupled transistor 908, such that the voltage on the rail 904 can be allowed to increase above VSS during a read operation. For example, the transistor 908 is an NMOS transistor having its gate coupled to its drain. The VSS rail 904 is also for example coupled to the VSS supply voltage via a transistor 910, which is for example an NMOS transistor controlled by the inverse of the read enable signal RE. Thus the VSS supply rail 904 is coupled to the VSS supply voltage except during read operations.

Operation of the CAM cell 900 of FIG. 9A will now be described in more detail with reference to FIG. 9B.

FIG. 9B is a timing diagram illustrating examples of the wordline signal WL1 or WL2, the bitline voltage, and the voltage S1 on the VSS supply rail 904 during a CAM read operation. The voltage on either the line WL1 or the line WL2 is brought to the supply voltage VDD, depending on the input data during the CAM read operation. The bitline BLL is for example coupled to a high voltage such as the supply voltage VDD. In the case of a CAM hit, the storage node at the high voltage, which is coupled to the supply voltage VDD, will be coupled to the bitline BLL, and thus there will be no change to the voltage state on the VSS supply rail. However, in the case of a CAM miss, the storage node storing a low voltage, which is coupled to the supply voltage rail VSS, will be charged by the voltage on the bitline BLL. FIG. 9B illustrates the case of a CAM miss, and as illustrated, the rise of the voltage at the storage node will cause the voltage on the VSS supply rail to start to rise, for example by around 100 mV or a few hundreds of mV. This voltage rise is detected by the detection circuit 902, and the output signal MOUT for example remains low to indicate a CAM miss.

While FIG. 9B illustrates the case of a CAM read operation, the detection circuit 902 can also be used for SRAM read operations. During an SRAM read operation, the bitline BLL is for example coupled to the supply voltage VDD, and only the signal WL1 is for example asserted. The data can thus be read using the detection circuit 902, the voltage on the supply rail VSS remaining low if the node V1 of the memory cell is at a high voltage, and the voltage on the supply rail VSS rising if the node V1 of the memory cell is at a low voltage.

An advantage of the embodiment of FIG. 9A is that the CAM and SRAM read operations can be performed at relatively high speed, without stability issues. Indeed, a fast read operation performed via the bitline BLL by allowing the bitline BLL to discharge below VDD, using a memory cell of a standard SRAM size and with the signal WL1 or WL2 at VDD and the rail VSS at ground, can lead to stability issues as it may result in a write operation to the cell. By performing the read operation via the VSS supply rail, the transistors of the memory cell can be sized to permit fast operation without causing stability issues in the cell.

Of course, while in the example of FIG. 9A the detection circuit 902 is coupled to the VSS supply rail, in alternative embodiments it could be coupled to the VDD supply rail and to the VDD supply voltage, and the bitline could be coupled to the supply voltage VSS during CAM and SRAM read operations. In such a case, writing to the memory cell is also for example performed with the bitline BLL at or around the supply voltage VDD.

It will be apparent to those skilled in the art that CAM and/or SRAM read operations performed using a supply voltage rail of the memory cells as described in relation with FIGS. 9A and 9B could be combined with any of the other embodiments described in the present disclosure.

An advantage of the embodiments described herein is that a compact CAM cell is provided, which is capable of operation both in a CAM mode and in an SRAM mode. Furthermore, the CAM cell can advantageously be read during a CAM read operation using only a single bitline independently coupled to both storage nodes of the CAM cell, and using a single sense amplifier coupled to the bitline.

Having thus described at least one illustrative embodiment, various alterations, modifications and improvements will readily occur to those skilled in the art.

For example, it will be apparent to those skilled in the art that while circuits have been described in which the transistors are MOS or TFET transistors, other transistor technologies could be used.

Furthermore, it will be apparent to those skilled in the art that the particular values of supply voltages mentioned herein are merely by way of example, and that other voltage levels could be used, depending for example on the transistor technology.

The invention claimed is:

1. A content addressable memory comprising at least one CAM cell comprising:
   first and second inverters cross-coupled between first and second storage nodes;
   a first transistor coupling the first storage node to a bitline, the first transistor being controlled by a first control signal;
   a second transistor coupling the second storage node to the bitline, the second transistor being controlled by a second control signal;
   a control circuit adapted to perform a CAM read operation by pre-charging the bitline to a first voltage level, and then selectively activating either the first or second transistor based on a bit of input data; and
   a detection circuit coupled to a first supply voltage rail of the first and second inverters and adapted to detect a CAM hit or miss based on the voltage level on said first supply voltage rail following the activation of the first or second transistor.

2. The CAM of claim 1, comprising a plurality of said CAM cells coupled to the bitline, said plurality of CAM cells forming a CAM word, and wherein the bits of input data of the plurality of CAM cells form a word, and the detection circuit is adapted to detect a word hit or miss based on the voltage level on the first supply voltage rail following the activation of the first or second transistor.

3. The CAM of claim 1, wherein the detection circuit is adapted to detect a hit by detecting a voltage change less than a first threshold, and to detect a miss by detecting a voltage change higher than the first threshold.

4. The CAM of claim 1, wherein the control circuit is further adapted to perform an SRAM read operation of a data value stored at the first and second storage nodes (V1, V2) by pre-charging the bitline to the first voltage level or to another voltage level, and activating the first transistor.

5. The CAM of claim 1, wherein the control circuit is further adapted to perform a write operation to the first and second storage nodes of the at least one CAM cell by coupling the bitline to the first voltage level or to another voltage level while selectively activating the first or second transistor based on a data bit to be written to the CAM cell.

6. The CAM of claim 1, wherein the bitline comprises first and second portions, the first transistor being coupled to the first portion and the second transistor being coupled to the second portion, the first and second portions being coupled together by a further transistor, the control circuit being adapted to perform a write operation to the at least one memory cell by deactivating the further transistor and applying independent voltages to the first and second portions.

7. The CAM of claim 1, wherein the first and second inverters of the at least one CAM cell are coupled between the first supply voltage rail and a second supply voltage rail, one of the first and second voltage rails receiving the first voltage level, and the other of the first and second voltage rails receiving a second voltage level higher than ground and lower than the first voltage level, and wherein during a write operation to the at least one CAM cell, one of the first and second transistors is activated by a voltage lower than the first voltage level.

8. The CAM of claim 1, wherein the at least one CAM cell further comprises:
  a third transistor coupled between the second storage node and a further bitline, the third transistor being controlled by the second control signal; and
  a fourth transistor coupled between the first storage node and the further bitline, the fourth transistor being controlled by the first control signal,
  wherein the first, second, third and fourth transistors are TFETs.

9. The CAM of claim 8, wherein the at least one CAM cell further comprises a fifth transistor coupled between the further bitline and a read out line, a control node of the fifth transistor being coupled to the second storage node.

10. The CAM of claim 1, comprising:
  at least one further CAM cell coupled to said bitline by a first transistor controlled by a first control signal and by a second transistor controlled by a second control signal, wherein the control circuit is adapted to mask said at least one further CAM cell during said CAM read operation by deactivating both of the first and second transistors of the at least one further CAM cell during the CAM read operation.

11. A method of performing a CAM (content addressable memory) operation in at least one CAM cell comprising: first and second inverters cross-coupled between first and second storage nodes; a first transistor coupling the first storage node to a bitline, the first transistor being controlled by a first control signal; and a second transistor coupling the second storage node to the bitline, the second transistor being controlled by a second control signal, the method comprising:
  pre-charging, by a control circuit, the bitline to a first voltage level;
  selectively activating, by the control circuit, either the first or second transistor based on a bit of input data; and
  detecting, by a detection circuit coupled to a first supply voltage rail of the first and second inverters, a hit or a miss based on the voltage level on said first supply voltage rail following the activation of the first or second transistor.

* * * * *